(12) United States Patent
Osada

(10) Patent No.: US 11,031,883 B2
(45) Date of Patent: Jun. 8, 2021

(54) METHOD OF MANUFACTURING ACTUATOR

(71) Applicant: HONDA MOTOR CO., LTD., Tokyo (JP)

(72) Inventor: Masahiko Osada, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 285 days.

(21) Appl. No.: 16/139,253

(22) Filed: Sep. 24, 2018

(65) Prior Publication Data

US 2019/0103819 A1 Apr. 4, 2019

(30) Foreign Application Priority Data

Sep. 29, 2017 (JP) .............................. JP2017-192080

(51) Int. Cl.
*H02N 1/00* (2006.01)
*H02N 2/00* (2006.01)
(Continued)

(52) U.S. Cl.
CPC ....... *H02N 1/006* (2013.01); *H01L 21/02104* (2013.01); *H01L 21/64* (2013.01);
(Continued)

(58) Field of Classification Search
CPC ........... H02N 1/006; H02N 2/04; H02N 2/22; H02N 2/02; H02N 2/001; H01L 21/02104;
(Continued)

(56) References Cited

U.S. PATENT DOCUMENTS

| 5,559,387 A * | 9/1996 | Beurrier .............. H01L 41/0836 310/328 |
| 2007/0114885 A1* | 5/2007 | Benslimane .......... H01L 41/297 310/311 |

(Continued)

FOREIGN PATENT DOCUMENTS

| JP | 2003-230288 | 8/2003 |
| JP | 2008-251833 | 10/2008 |
| JP | 2008-277729 | 11/2008 |

OTHER PUBLICATIONS

German Office Action and Search Report for German Patent Application No. 102018216579.3 dated Apr. 4, 2019.

(Continued)

*Primary Examiner* — Peter Dungba Vo
*Assistant Examiner* — Jeffrey T Carley
(74) *Attorney, Agent, or Firm* — Amin, Turocy & Watson, LLP

(57) ABSTRACT

A method of manufacturing an actuator includes a first electrode layer forming step, a dielectric elastomer layer forming step, and a second electrode layer forming step, and obtains the actuator in which dielectric elastomer layers and electrode layers have been concentrically laminated. In the first electrode layer forming step, an electrode material is provided to an outer circumferential surface of a shaft section to form the electrode layer. In the dielectric elastomer layer forming step, a sheet-like or paste-like dielectric elastomer material is provided to an outer circumferential surface of the electrode layer to form the dielectric elastomer layer. In the second electrode layer forming step, the electrode material is provided to an outer circumferential surface of the dielectric elastomer layer to form the electrode layer.

8 Claims, 20 Drawing Sheets

(51) Int. Cl.
    *H02N 2/02*     (2006.01)
    *H02N 2/04*     (2006.01)
    *H01L 21/02*     (2006.01)
    *H01L 21/64*     (2006.01)
    *H01L 21/673*     (2006.01)

(52) U.S. Cl.
    CPC .. *H01L 21/67303* (2013.01); *H01L 21/67306* (2013.01); *H01L 21/67309* (2013.01); *H02N 2/001* (2013.01); *H02N 2/02* (2013.01); *H02N 2/04* (2013.01); *H02N 2/22* (2013.01)

(58) Field of Classification Search
    CPC ............... H01L 21/64; H01L 21/67303; H01L 21/67306; H01L 21/67309
    See application file for complete search history.

(56) References Cited

U.S. PATENT DOCUMENTS

| | | | | |
|---|---|---|---|---|
| 2008/0022517 | A1* | 1/2008 | Rosenthal | ........... H01L 41/0966 29/829 |
| 2008/0238258 | A1* | 10/2008 | Ishiguro | .............. H01L 41/0986 310/328 |
| 2009/0127734 | A1* | 5/2009 | Nozawa | ................ H01L 41/333 264/209.1 |
| 2009/0127979 | A1* | 5/2009 | Takeuchi | ............ H01L 41/0836 310/328 |
| 2010/0118405 | A1* | 5/2010 | Allison | .................... H02N 2/02 359/579 |
| 2012/0060355 | A1* | 3/2012 | Tsuchikawa | .......... H01L 41/193 29/592.1 |
| 2013/0253424 | A1* | 9/2013 | Kim | ....................... H01L 41/29 604/95.05 |
| 2016/0144091 | A1* | 5/2016 | Breedon | ................ A61F 2/0036 623/3.29 |
| 2016/0155532 | A1* | 6/2016 | Kokubo | ................ B06B 1/0644 310/334 |

OTHER PUBLICATIONS

Japanese Office Action for Japanese Patent Application No. 2017-192080 dated Nov. 4, 2020.

* cited by examiner

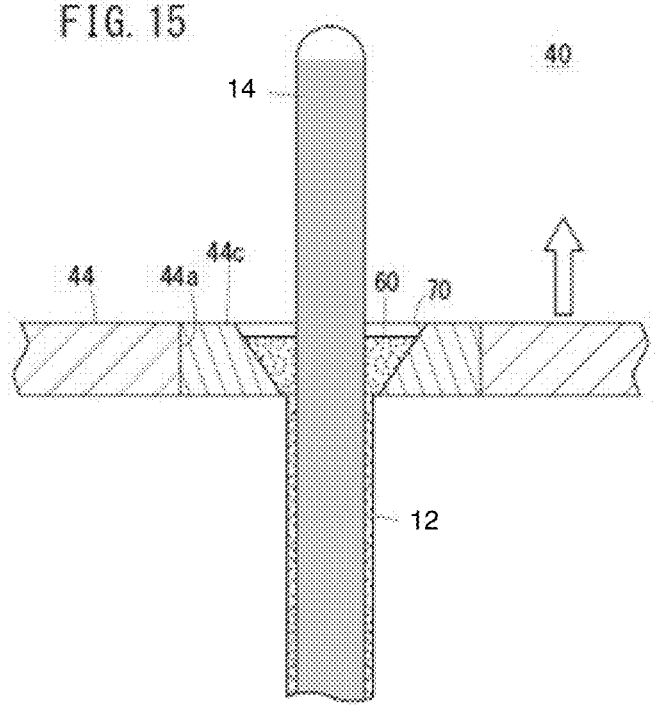

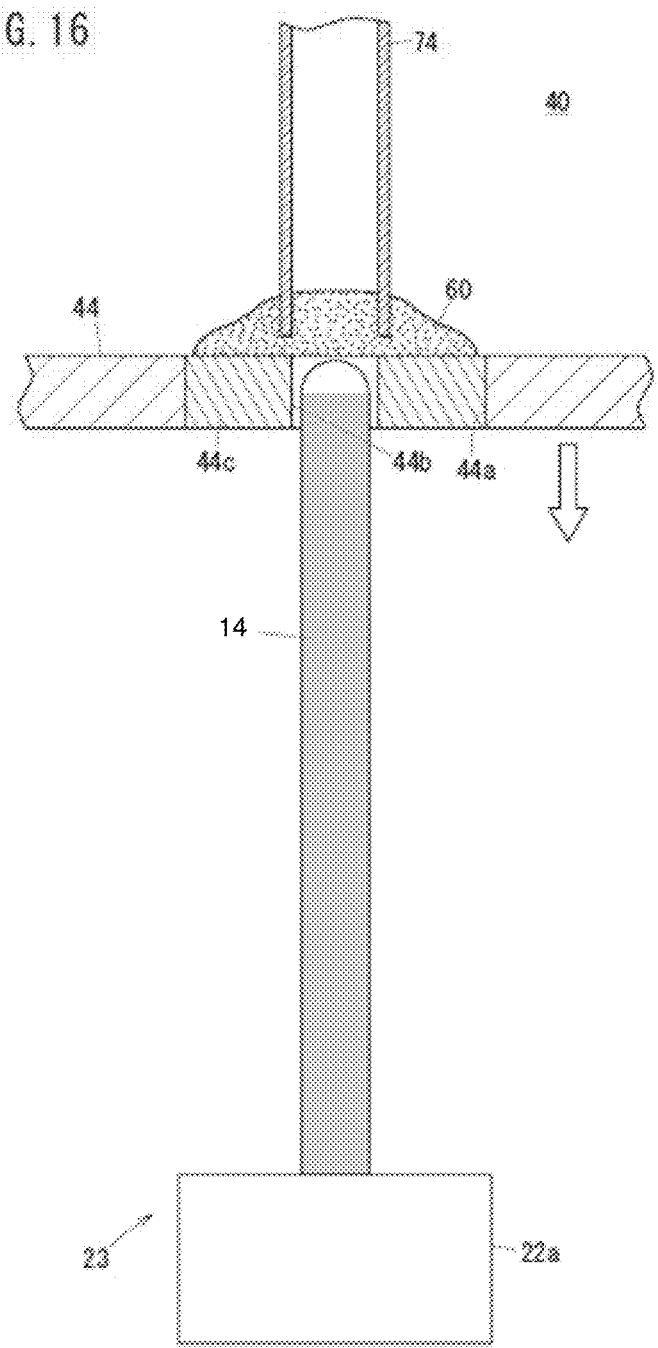

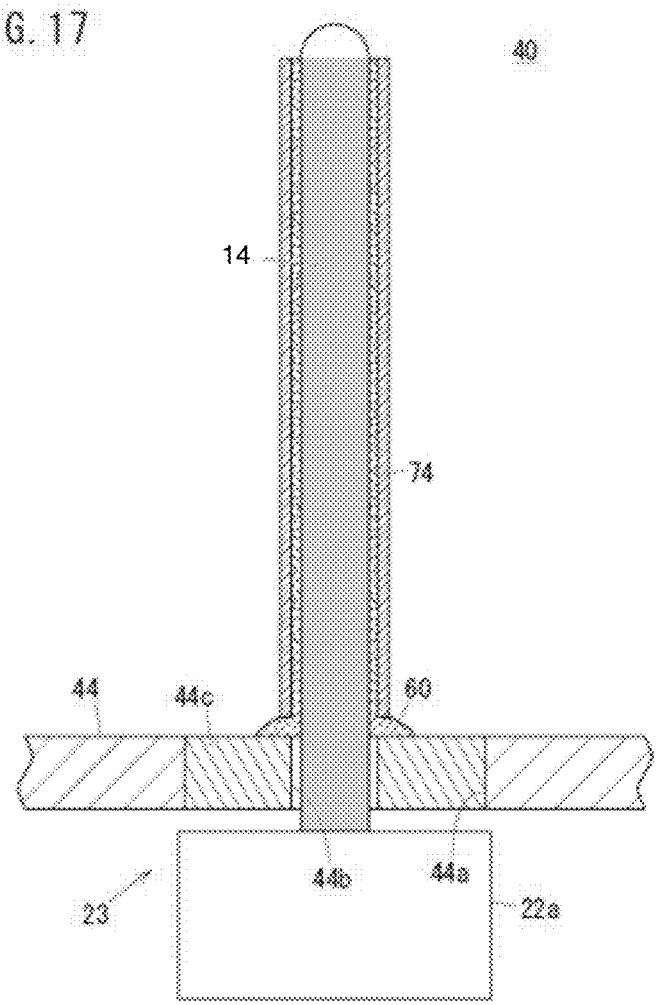

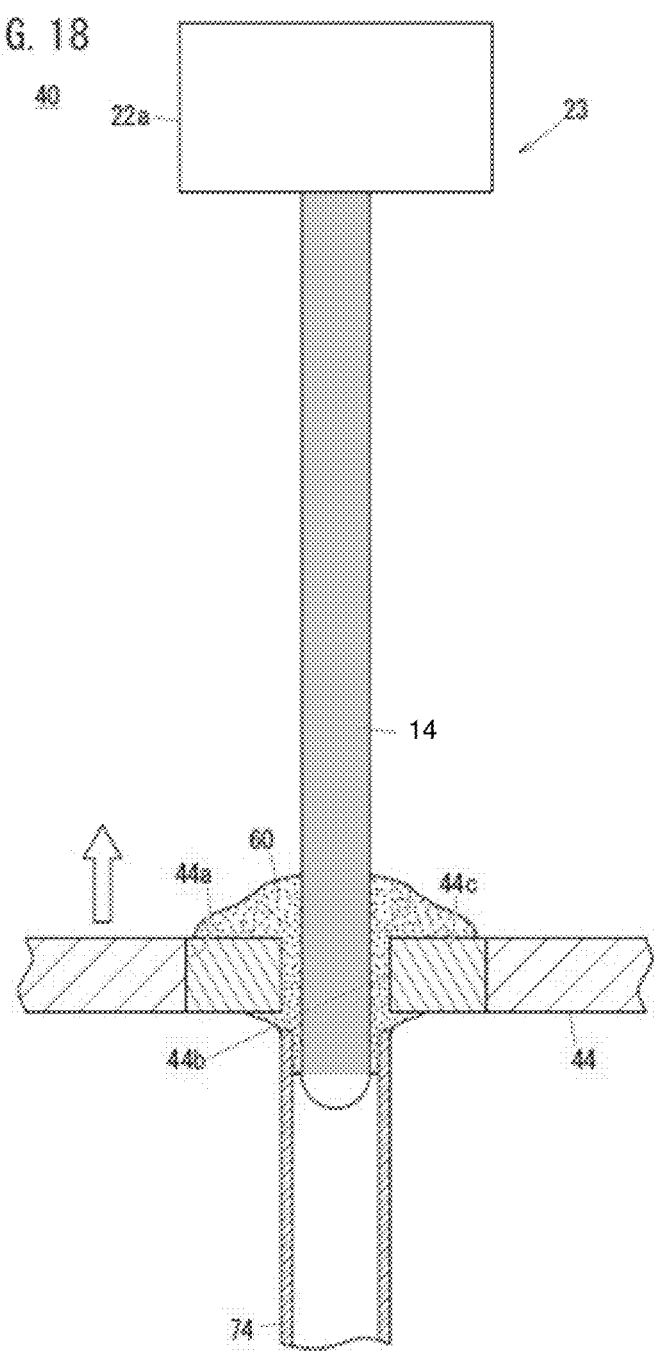

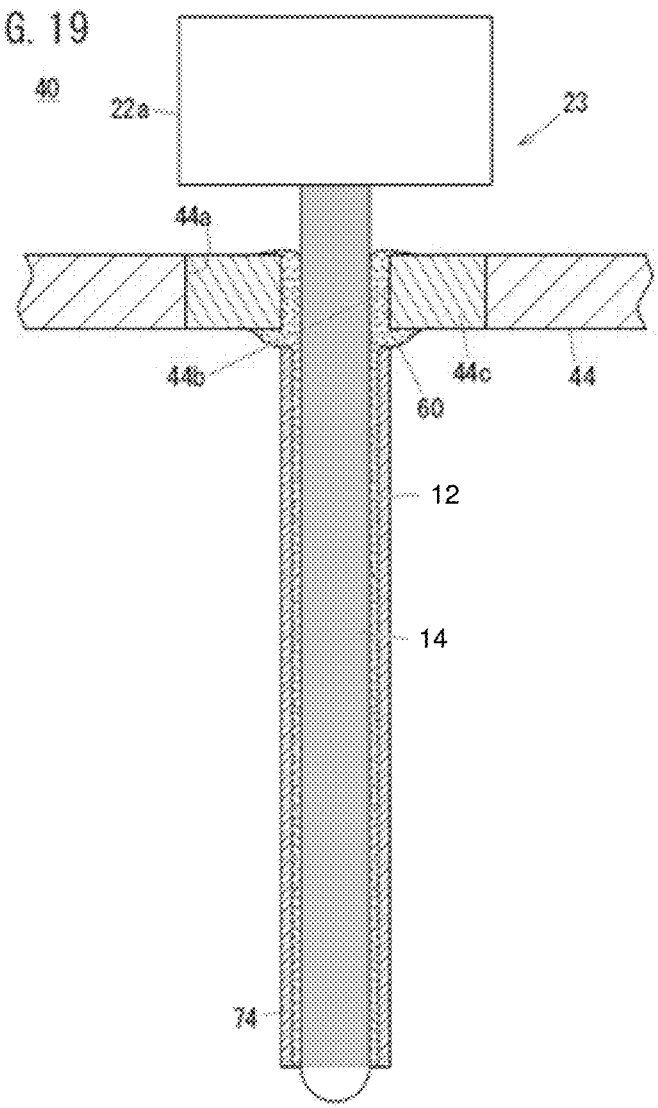

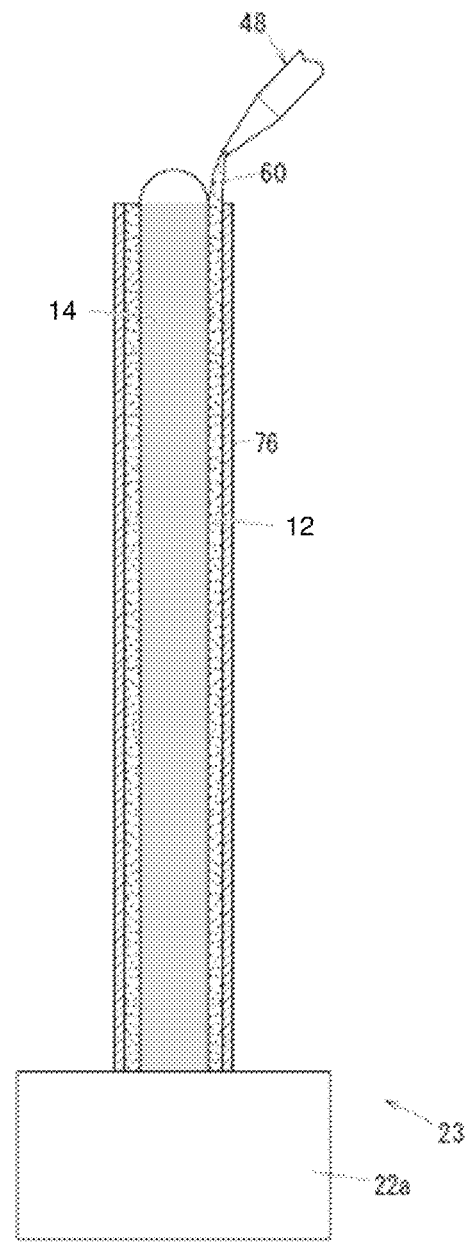

METHOD OF MANUFACTURING ACTUATOR

CROSS-REFERENCE TO RELATED APPLICATION

This application is based upon and claims the benefit of priority from Japanese Patent Application No. 2017-192080 filed on Sep. 29, 2017, the contents of which are incorporated herein by reference.

BACKGROUND OF THE INVENTION

Field of the Invention

The present invention relates to a method of manufacturing an actuator in which cylindrical dielectric elastomer layers and electrode layers have been concentrically laminated.

Description of the Related Art

In an actuator in which cylindrical dielectric elastomer layers and electrode layers have been concentrically laminated with a cross section configured in a tree-growth-ring-like form, a larger output and displacement amount can be obtained by a smaller volume compared to when plate-like dielectric elastomer layers and electrode layers have been laminated or when belt-like dielectric elastomer layers and electrode layers have been wrapped around such that their cross section is spirally shaped. However, manufacturing of the actuator having the tree-growth-ring-like cross section is more difficult compared to that of the actuator obtained by laminating the plate-like dielectric elastomer layers and electrode layers or the actuator obtained by wrapping around the belt-like dielectric elastomer layers and electrode layers.

As a method of manufacturing an actuator having a tree-growth-ring-like cross section, there has been proposed in, for example, Japanese Patent Application Laid-Open Publication No. 2008-251833 alternately dipping a core material in an electrode material solution for forming the electrode layer and a dielectric material solution for forming the dielectric elastomer layer, or alternately spraying the core material with the electrode material solution and the dielectric material solution.

SUMMARY OF THE INVENTION

In the method of manufacturing by dipping of the above-described kind, there is concern that manufacturing costs soar due to there being required sufficiently large amounts of the electrode material solution and the dielectric material solution to be able to immerse the core material, or that manufacturing efficiency lowers due to there being required time to dry the electrode material solution and the dielectric material solution that has adhered every time the core material is immersed.

Moreover, in the method of manufacturing by spraying as described above, it is particularly easy for the dielectric material solution to become stuck to an injection port of a spray nozzle, and so on, hence management or maintenance of the spray nozzle, and so on, ends up getting troublesome.

A main object of the present invention is to provide a method of manufacturing an actuator by which it is easy to obtain an actuator in which cylindrical dielectric elastomer layers and electrode layers have been concentrically laminated.

According to an embodiment of the present invention, there is provided a method of manufacturing an actuator in which a cylindrical dielectric elastomer layer and cylindrical electrode layers have been concentrically laminated in such a manner that the electrode layers respectively face an inner circumferential surface and an outer circumferential surface of the dielectric elastomer layer, the method including: a first electrode layer forming step in which, with a layer forming jig having a shaft section, an electrode material is provided to an outer circumferential surface of the shaft section, thereby forming the electrode layer; a dielectric elastomer layer forming step in which a sheet-like or paste-like dielectric elastomer material is provided to an outer circumferential surface of the electrode layer, thereby forming the dielectric elastomer layer; and a second electrode layer forming step in which the electrode material is provided to the outer circumferential surface of the dielectric elastomer layer, thereby forming the electrode layer.

In this method of manufacturing an actuator, an electrode layer is formed on the outer circumferential surface of the shaft section by the first electrode layer forming step. In addition, the sheet-like or paste-like dielectric elastomer material is provided to the outer circumferential surface of the electrode layer, thereby forming a dielectric elastomer layer, by the dielectric elastomer layer forming step. Moreover, an electrode layer is further formed on the outer circumferential surface of the dielectric elastomer layer by the second electrode layer forming step. As a result, the dielectric elastomer layer and the electrode layers can be laminated in a concentric form where the cylindrical electrode layers respectively face the inner circumferential surface and the outer circumferential surface of the cylindrical dielectric elastomer layer.

As described above, in this method of manufacturing an actuator, the sheet-like or paste-like dielectric elastomer material is employed to form the dielectric elastomer layer. Therefore, unlike when the dielectric elastomer layer is formed by dipping, for example, it is possible to avoid there being required a large amount of the dielectric elastomer material. Moreover, unlike when the dielectric elastomer layer is formed by spraying, for example, it is possible to avoid there being required a troublesome step of the likes of management or maintenance of the spray nozzle for forming the dielectric elastomer layer.

It is clear from the above that this method of manufacturing an actuator makes it possible to obtain easily and at low cost an actuator in which cylindrical dielectric elastomer layers and electrode layers have been concentrically laminated.

In the above-described method of manufacturing an actuator, a configuration may be adopted where in the dielectric elastomer layer forming step, by arranging a surface direction of the sheet-like dielectric elastomer material and an axial direction of the shaft section so as to intersect each other and by applying a tensile force to the dielectric elastomer material in a direction along the axial direction of the shaft section, adopting as a fulcrum a tip surface of the shaft section that has been abutted on the dielectric elastomer material, the dielectric elastomer material is caused to lie along the outer circumferential surface of the electrode layer, thereby forming the dielectric elastomer layer.

In this case, in the dielectric elastomer layer forming step, a tensile force is applied to the sheet-like dielectric elastomer material to cause it to lie along the outer circumferential surface of the electrode layer, whereby the dielectric elastomer layer can be formed easily and efficiently by simple equipment.

In the above-described method of manufacturing an actuator, there is preferably further included a cutting step in which, after the dielectric elastomer layer forming step and the second electrode layer forming step are repeated to laminate a required number of the dielectric elastomer layers and the electrode layers, thereby forming a laminated body, both ends in an axial direction of the laminated body are cut. In this case, cutting both ends in the axial direction of the laminated body makes it possible to easily obtain an actuator in which cylindrical dielectric elastomer layers and electrode layers have been concentrically laminated.

In the above-described method of manufacturing an actuator, a configuration may be adopted where in the dielectric elastomer layer forming step, with a plate section provided with an insertion hole that has a diameter which is larger than an outer diameter of the electrode layer and which is of a size that is determined according to a coating thickness of the paste-like dielectric elastomer material, the paste-like dielectric elastomer material is disposed on the insertion hole, and the plate section and the shaft section are moved relatively along the axial direction in a state of the shaft section having been inserted in the insertion hole, whereby the dielectric elastomer material is coated on the outer circumferential surface of the electrode layer.

In this case, by the plate section and the shaft section being moved relatively, it is possible for the paste-like dielectric elastomer material to be coated on the outer circumferential surface of the electrode layer easily with a uniform thickness. As a result, a dielectric elastomer layer of desired thickness can be formed simply and with high precision, hence making it possible to easily achieve an improvement in quality of the actuator.

In the above-described method of manufacturing an actuator, there is preferably further included a step in which, from a center to an outer side in a radial direction of the concentrically laminated dielectric elastomer layer and electrode layers, every second adjacent one of the electrode layers and a first wiring are electrically connected, and each one of the electrode layers not connected to the first wiring, and a second wiring are electrically connected. By providing the first wiring and the second wiring in this way and applying a voltage via the first wiring and second wiring, the dielectric elastomer layer can be efficiently deformed, hence making it possible to obtain an actuator showing a good output or displacement amount.

In the above-described method of manufacturing an actuator, it is preferable to employ a material selected from the group consisting of acrylic, silicone, and polyurethane as the dielectric elastomer material. Employing these dielectric elastomer materials makes it possible to obtain an actuator that excels in flexibility and shows a good output or displacement amount.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIG. 15 is an enlarged cross-sectional view of an essential part of a manufacturing apparatus provided with an insertion hole according to a modified example employed in a method of manufacturing an actuator according to a third embodiment of the present invention;

FIG. 16 is an explanatory diagram explaining what it looks like when a first cylindrical member is disposed on a paste-like dielectric elastomer material disposed on a plate section, in a dielectric elastomer layer forming step in a method of manufacturing an actuator according to a fourth embodiment of the present invention;

FIG. 17 is an explanatory diagram explaining what it looks like when the paste-like dielectric elastomer material is coated on an electrode layer, in the dielectric elastomer layer forming step of FIG. 16;

FIG. 18 is an explanatory diagram explaining what it looks like when a paste-like dielectric elastomer material is disposed on an upper surface side of a plate section and a first cylindrical member is disposed on a lower surface side of the plate section, in a dielectric elastomer layer forming step in a method of manufacturing an actuator according to a fifth embodiment of the present invention;

FIG. 19 is an explanatory diagram explaining what it looks like when the paste-like dielectric elastomer material is coated on an electrode layer, in the dielectric elastomer layer forming step of FIG. 18; and FIG. 20 is an explanatory diagram explaining a dielectric elastomer layer forming step in a method of manufacturing an actuator according to a sixth embodiment of the present invention.

DESCRIPTION OF THE PREFERRED EMBODIMENTS

Preferred embodiments of a method of manufacturing an actuator according to the present invention will be presented and described in detail below with reference to the accompanying drawings.

Figure 1:
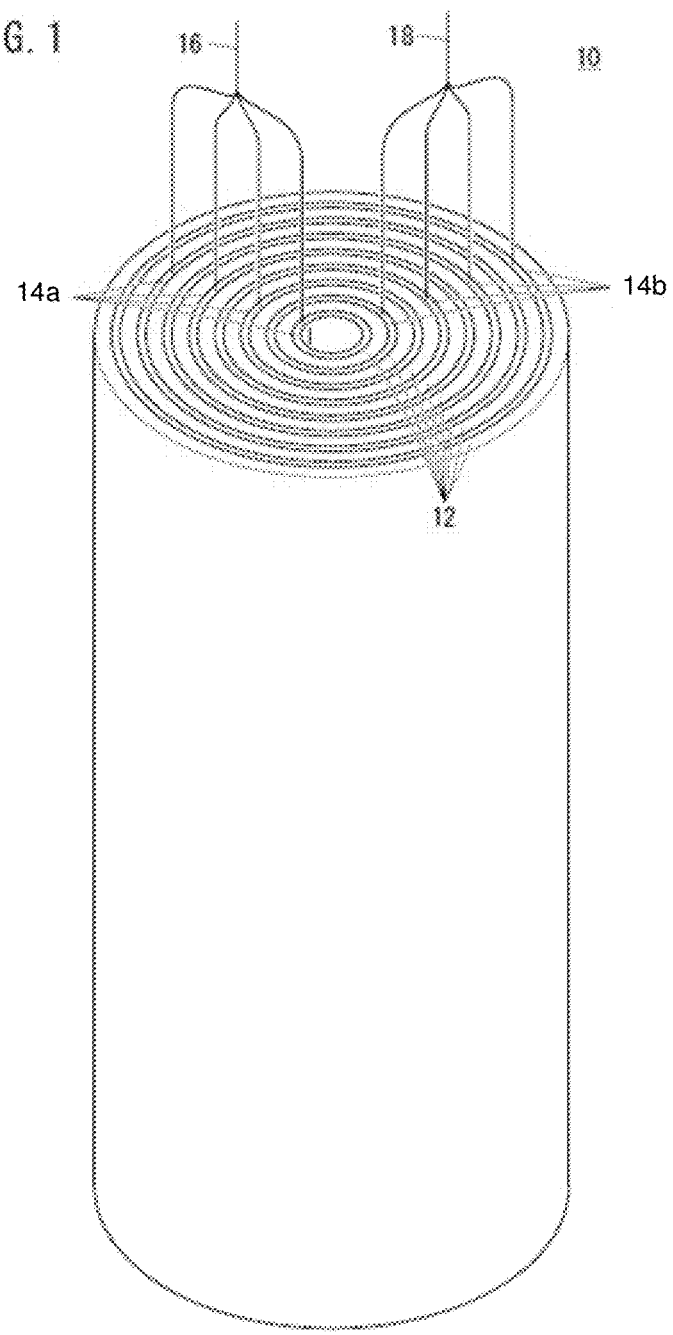
FIG. 1 is a schematic perspective view of an actuator obtained by applying methods of manufacturing an actuator according to embodiments of the present invention.
Figure 2:
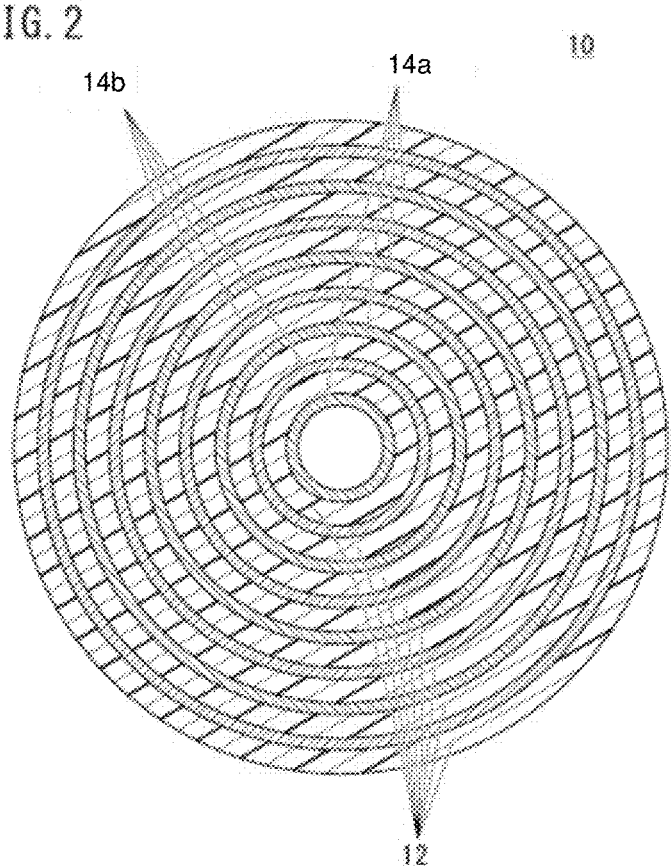
FIG. 2 is a cross-sectional view orthogonal to an axial direction of the actuator of FIG. 1.

First, an actuator 10 obtained by methods of manufacturing an actuator according to the embodiments, will be described with reference to FIGS. 1 and 2. The actuator 10 is configured by concentrically laminating a cylindrical dielectric elastomer layer 12 and a cylindrical electrode layer 14 in such a manner that the electrode layer 14 faces each of an inner circumferential surface and an outer circumferential surface of the dielectric elastomer layer 12. Therefore, a cross section orthogonal to an axial direction of the actuator 10 has a tree-growth-ring-like form in which the dielectric elastomer layers 12 and the electrode layers 14 are alternately disposed. Moreover, as shown in FIG. 1, a first wiring 16 and a second wiring 18 are connected to one end surface in the axial direction of the actuator 10, and the other end surface is covered by an insulating film (not illustrated) having elastic properties configured from the likes of acrylic, for example. Volumes of the concentrically laminated electrode layers 14 get larger from a center toward an outer side in a radial direction of a cylinder. Hence, voltages of each of the electrode layers 14 must be adjusted in order to configure such that displacements in the axial direction of the actuator 10 are equal. This can be handled by an adjustment method in which resistances appropriate to differences in volume of each of the electrode layers 14 are inserted between the first wiring 16 and second wiring 18 and each of the electrode layers 14.

The dielectric elastomer layer 12 is preferably configured from a material such as acrylic, silicone, or polyurethane, for example, but is not particularly limited to these, and a material having flexibility and exhibiting a high dielectric constant and high dielectric breakdown strength may be suitably employed.

The electrode layer 14 is configured from: a positive electrode layer 14a applied with a positive voltage via the first wiring 16; and a negative electrode layer 14b applied with a negative voltage via the second wiring 18. The positive electrode layers 14a and the negative electrode layers 14b are alternately disposed sandwiching the dielectric elastomer layers 12. The following may be cited as a material of the electrode layer 14, namely, for example, the likes of a material formed by mixing carbon black or particles of a metal such as aluminum in a resin or the like having elastic properties capable of following elastic deformation of the dielectric elastomer layer 12.

The number of laminations of these dielectric elastomer layers 12 and electrode layers 14 is not particularly limited, and, for example, may be appropriately set so as to obtain a required output or displacement amount, in a range representing dimensions corresponding to a space where the actuator 10 is to be disposed.

When the actuator 10 configured basically as described above is applied with a voltage via the first wiring 16 and the second wiring 18, the dielectric elastomer layer 12 compressively deforms in a thickness direction resisting an elastic force of the dielectric elastomer layer 12, hence the actuator 10 extends in an axial direction. When this application of the voltage is stopped, the dielectric elastomer layer 12 is released from a compressively deformed state, and the actuator 10 contracts in the axial direction. Hence, the actuator 10 enables a displacement to be made and a driving force to be outputted in the axial direction, in response to application of the voltage.

In this actuator 10, the dielectric elastomer layers 12 and the electrode layers 14 are disposed concentrically, as described above. As a result, a larger output and displacement amount can be obtained by a smaller number of laminations compared to, for example, in an actuator (not illustrated) obtained by laminating plate-like dielectric elastomer layers and electrode layers. Moreover, an interlayer frictional force occurring during extension/contraction can be made smaller or a contact area of the dielectric elastomer layer 12 and electrode layer 14 can effectively be made larger compared to, for example, in an actuator (not illustrated) whose cross section is spirally shaped obtained by belt-like dielectric elastomer layers and electrode layers being wrapped around in a laminated state. Therefore, in the actuator 10, output and displacement amount per unit volume can be improved more than in the above-described other actuators.

Next, a method of manufacturing an actuator (hereafter, referred to also simply as a method of manufacturing) according to a first embodiment will be described with reference to FIGS. 3 to 9.

In this method of manufacturing, the above-described actuator 10 can be manufactured using a manufacturing apparatus 20, for example. The manufacturing apparatus 20 includes: a layer forming jig 23 having a base section 22a and a shaft section 22 that projects from the base section 22a; a frame member 24; a drive mechanism (not illustrated); and a coating mechanism 26.

The shaft section 22 is configured from the likes of a rod-shaped metal, for example, and a diameter of the shaft section 22 is set to a size appropriate to a diameter of the electrode layer 14 disposed at a center in a radial direction of the actuator 10. Moreover, a length in an axial direction of the shaft section 22 is set larger than a length in the axial direction of the actuator 10.

The frame member 24 has a rectangular frame-like form, for example, in which the separation distance between fellow short sides and the separation distance between fellow long sides can be adjusted, and the frame member 24 can grip a peripheral edge section of a sheet-like dielectric elastomer material 28. Therefore, by using the frame member 24 to adjust the respective distances of the fellow short sides and fellow long sides in a state where the peripheral edge section of the dielectric elastomer material 28 has been gripped, it is possible for a tensile force to be applied in a surface direction to the dielectric elastomer material 28.

The dielectric elastomer material 28 is configured by forming the above-described material of the dielectric elastomer layer 12 in a sheet-like shape. If the dielectric elastomer material 28 is configured from acrylic, then, for example, "VHB4910" (product name) manufactured by 3M Company, or the like, configured in a sheet-like shape, may be employed.

The drive mechanism is configured to allow the shaft section 22 and the frame member 24 to be moved relatively. At this time, the drive mechanism is able to insert the shaft section 22 in an inside of the frame member 24 or separate the shaft section 22 and the frame member 24, in such a manner that the axial direction of the shaft section 22 passes along substantially a center of the inside of the frame member 24. The coating mechanism 26 is configured such that an electrode material 30 that has been configured in liquid form by adding a solvent to the above-described material of the electrode layer 14, can be jetted toward the shaft section 22, thereby spray-coating the shaft section 22.

Figure 3:
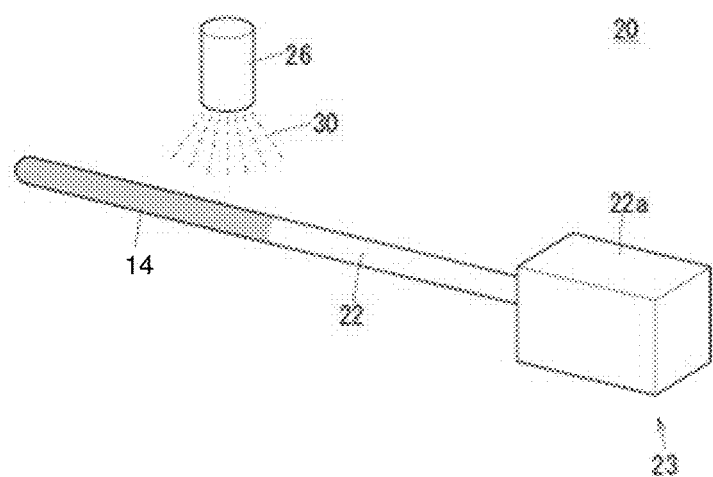
FIG. 3 is an explanatory diagram explaining a first electrode layer forming step in a method of manufacturing an actuator according to a first embodiment of the present invention.

In the method of manufacturing according to the first embodiment employing the manufacturing apparatus 20 configured basically as above, first, as shown in FIG. 3, there is performed a first electrode layer forming step in which the electrode material 30 is provided so as to attain a desired thickness, to an outer circumferential surface of the shaft section 22, by the coating mechanism 26, and the solvent in the electrode material 30 is evaporated, thereby forming the electrode layer 14.

Figure 4:
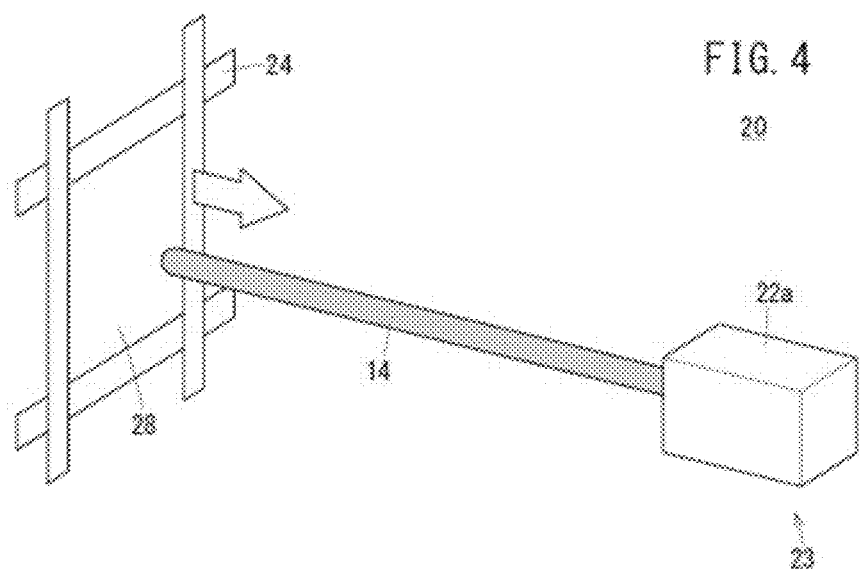
FIG. 4 is an explanatory diagram explaining what it looks like when a tip surface of a shaft section is abutted on a sheet-like dielectric elastomer material, in a dielectric elastomer layer forming step after the first electrode layer forming step of FIG. 3.

Next, there is performed a dielectric elastomer layer forming step in which the dielectric elastomer material 28 is provided to an outer circumferential surface of the electrode layer 14, thereby forming the dielectric elastomer layer 12. Specifically, as shown in FIG. 4, the frame member 24 is used to grip the peripheral edge section of the dielectric elastomer material 28, and thereby apply a tensile force in the surface direction. In this state, the shaft section 22 and the frame member 24 are moved relatively by the drive mechanism. As a result, the tip surface of the shaft section 22 is abutted on substantially a center in the surface direction of the dielectric elastomer material 28 that has been gripped on the inside of the frame member 24.

Figure 5:
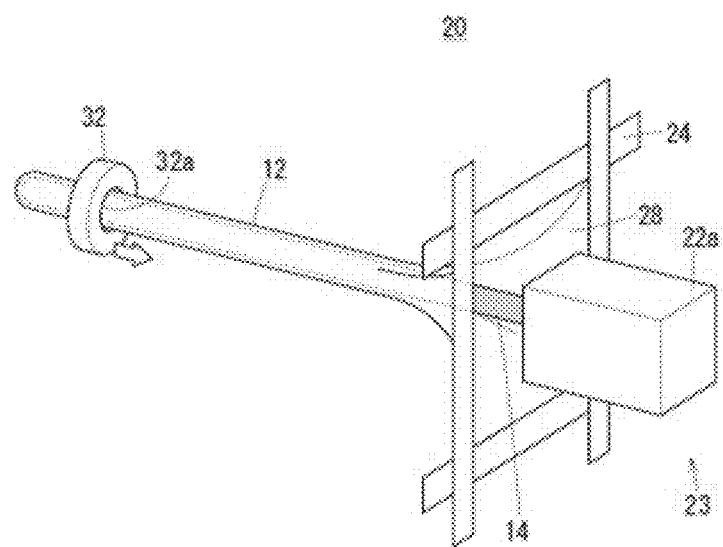
FIG. 5 is an explanatory diagram explaining what it looks like when the sheet-like dielectric elastomer material is caused to lie along an electrode layer, in the dielectric elastomer layer forming step of FIG. 4.

Then, the shaft section 22 and the frame member 24 are further moved relatively by the drive mechanism. As a result, as shown in FIG. 5, a tensile force can be applied to the dielectric elastomer material 28 in a direction along the axial direction of the shaft section 22, with the tip surface of the shaft section 22 as a fulcrum, whereby the dielectric elastomer material 28 is caused to lie along the outer circumferential surface of the electrode layer 14. As a result, the dielectric elastomer layer 12 facing the outer circumferential surface of the electrode layer 14 can be formed.

Note that, as shown in FIG. 5, this dielectric elastomer layer forming step may be performed by further employing a ring member 32 having formed therein a through-hole 32a of a diameter that is determined according to an outer diameter of the dielectric elastomer layer 12. In this case, when applying or after having applied the tensile force to the dielectric elastomer material 28 in the direction along the axial direction of the shaft section 22 as described above, the shaft section 22 is inserted from its tip side in the through-hole 32a of the ring member 32.

Then, the ring member 32 is moved relatively up to a base end side of the shaft section 22, while an inner wall surface of the through-hole 32a and an outer circumferential surface of the dielectric elastomer material 28 are slid against each other. As a result, it can be suppressed that a gap occurs between the outer circumferential surface of the electrode layer 14 and the dielectric elastomer material 28, and it becomes possible for the dielectric elastomer layer 12 to be favorably laid along the outer circumferential surface of the electrode layer 14.

Figure 6:
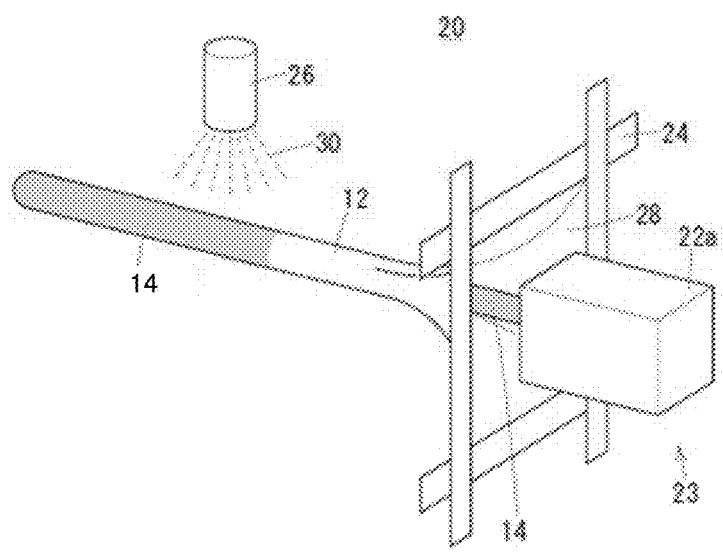
FIG. 6 is an explanatory diagram explaining a second electrode layer forming step after the dielectric elastomer layer forming step of FIG. 5.

Next, as shown in FIG. 6, there is performed a second electrode layer forming step in which the electrode material 30 is provided so as to attain a desired thickness, to the outer circumferential surface of the dielectric elastomer layer 12, by the coating mechanism 26, and the solvent is evaporated, thereby forming the electrode layer 14. As a result, the electrode layer 14, the dielectric elastomer layer 12, and the electrode layer 14 can be laminated as, respectively, a first layer, a second layer, and a third layer, on the outer circumferential surface of the shaft section 22.

Figure 7:
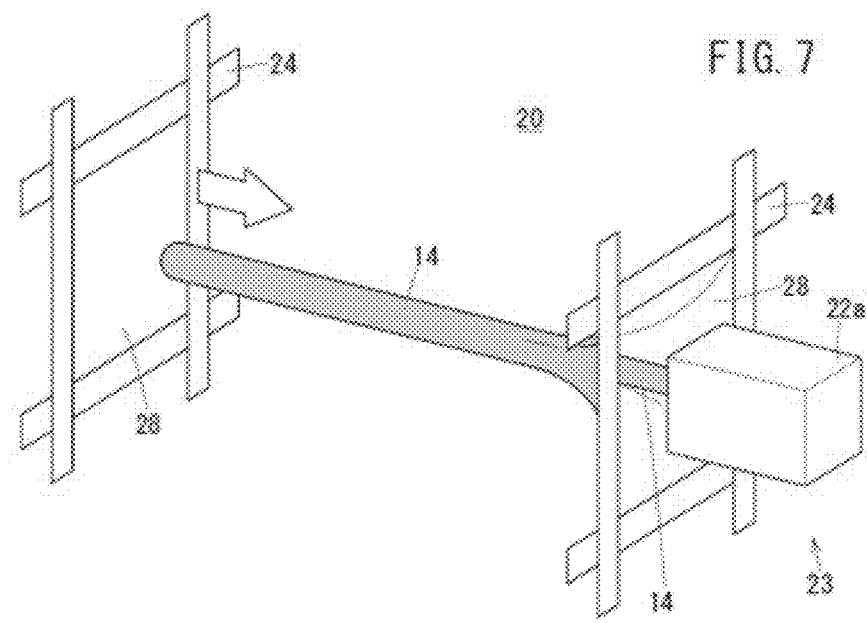
FIG. 7 is an explanatory diagram explaining the dielectric elastomer layer forming step after the second electrode layer forming step of FIG. 6.

Next, as shown in FIG. 7, the dielectric elastomer layer forming step is performed similarly to as described above, with the second layer dielectric elastomer layer 12, which has had the electrode layer 14 formed on its outer circumferential surface, left fixed to the shaft section 22. This makes it possible for the dielectric elastomer layer 12 (refer to FIGS. 1 and 2) to be formed as a fourth layer on the outer circumferential surface of the shaft section 22.

Figure 8:
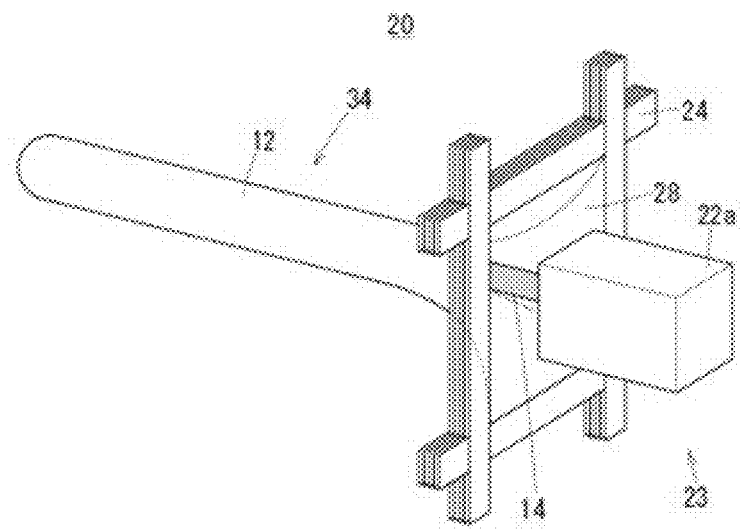
FIG. 8 is an explanatory diagram of a laminated body formed by repeating a plurality of times the second electrode layer forming step and the dielectric elastomer layer forming step, after the dielectric elastomer layer forming step of FIG. 7.

By thus repeatedly performing the above-described dielectric elastomer layer forming step and second electrode layer forming step, it is possible to obtain a laminated body 34 that has laminated therein a required number of the electrode layers 14 and dielectric elastomer layers 12, as shown in FIG. 8.

Figure 9:
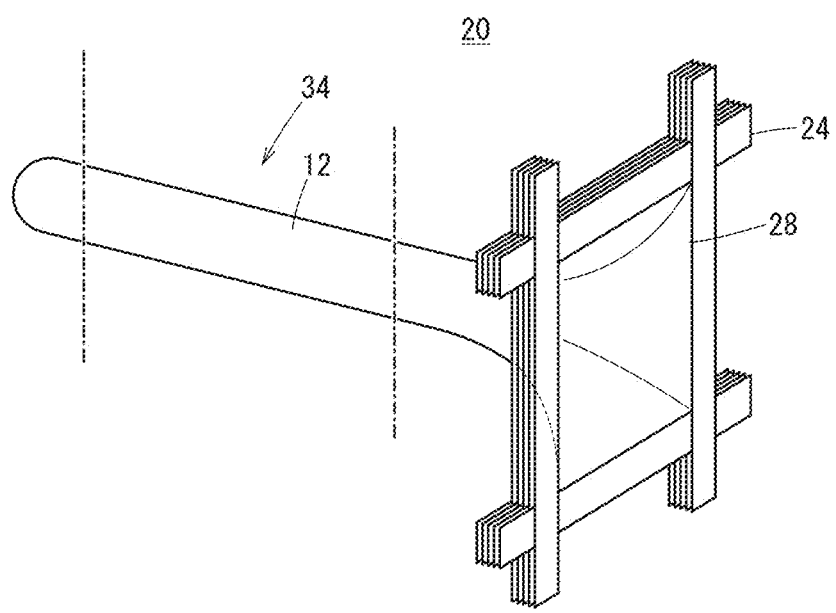
FIG. 9 is an explanatory diagram explaining a cutting step performed on the laminated body of FIG. 8.

After extracting the shaft section 22 from the laminated body 34, there is performed a cutting step in which both ends in the axial direction of the laminated body 34 are cut along the one dot-chain lines of FIG. 9. As a result, a precursor (not illustrated) of the above-described actuator 10 is obtained, and, by the first wiring 16 and the second wiring 18 being provided to one end surface side in the axial direction of the precursor and the insulating film being provided to the other end surface side in the axial direction of the precursor, it is possible to obtain the actuator 10 shown in FIG. 1.

In other words, after the cutting step, on the one end surface side in the axial direction of the precursor, from a center to an outer side in the radial direction of the concentrically laminated dielectric elastomer layers 12 and electrode layers 14, every second adjacent one of the electrode layers 14 (positive electrode layers 14a) and the first wiring 16 are electrically connected. Moreover, each one of the electrode layers 14 (negative electrode layers 14b) not connected to the first wiring 16, and the second wiring 18 are electrically connected (refer to FIG. 1 concerning each). This results in the actuator 10 being obtained. In the actuator 10 obtained by the method of manufacturing according to the first embodiment, there occurs a force by which the dielectric elastomer layer 12 attempts to return to the same plane as the sheet-like dielectric elastomer material 28. Therefore, it is desirable to, for example, stabilize the actuator 10 by heat-treating it, or use the actuator 10 while applying a tensile force to both of its ends.

As described above, in the method of manufacturing according to the first embodiment, the dielectric elastomer layer 12 can be easily and efficiently formed using the sheet-like dielectric elastomer material 28. Therefore, unlike when the dielectric elastomer layer 12 is formed by the likes of dipping, for example, it is possible to avoid there being required a large amount of a liquid form dielectric elastomer material (not illustrated) or there being required a drying step every time the dielectric elastomer layer 12 is formed. Moreover, unlike when the dielectric elastomer layer 12 is formed by spraying, for example, it is possible to avoid there being required a troublesome step of the likes of management or maintenance of a spray nozzle for forming the dielectric elastomer layer 12.

It is clear from the above that due to this method of manufacturing, an actuator 10 in which cylindrical dielectric elastomer layers 12 and electrode layers 14 have been concentrically laminated can be obtained easily and efficiently, and moreover at low cost, using simple equipment like the manufacturing apparatus 20.

Next, a method of manufacturing according to a second embodiment will be described with reference to FIGS. 10 to 14. Note that, among the configuring elements shown in FIGS. 10 to 14, those displaying functions and advantages the same as or similar to those of the configuring elements shown in FIGS. 3 to 9 will be assigned with the same reference symbols as those assigned in FIGS. 3 to 9, and detailed descriptions thereof will be omitted.

In this method of manufacturing, the actuator 10 can be manufactured using a manufacturing apparatus 40, for example. The manufacturing apparatus 40 includes: the layer forming jig 23 having the base section 22a and the shaft section 22; a plate section 44; a drive mechanism 46; the coating mechanism 26; and a supply mechanism 48.

The plate section 44 is formed in a plate-like shape from the likes of a metal, for example, and has a through-hole 44a formed in substantially its center in a surface direction. Moreover, the through-hole 44a is provided with an adjusting mechanism that allows adjustment of a diameter of an insertion hole 44b formed in an inside of the through-hole 44a.

The adjusting mechanism can employ a variety of configurations enabling the diameter of the insertion hole 44b to be adjusted. For example, a plurality of disk-shaped members 44c whose inner diameters differ from each other may be prepared, and one selected from these may be detachably attached to the through-hole 44a, as the adjusting mechanism. In this case, the diameter of the insertion hole 44b can be set to a size that accords with the inner diameter of the disk-shaped member 44c attached to the through-hole 44a. Moreover, the adjusting mechanism may adjust the diameter of the insertion hole 44b using the likes of a publicly known camera diaphragm structure or ball screw structure (neither of which is illustrated).

The drive mechanism 46 includes: a pair of guide rails 52 erected on a fixing pedestal 50 and each provided with a rack 52a; supports 54 that each have a pinion (not illustrated) engaging with the rack 52a and that support the plate section 44 in a manner enabling the plate section 44 to be raised/lowered with respect to the guide rails 52; and a drive section 56 that performs rotary drive of the pinions.

The base section 22a is fixed to the fixing pedestal 50 in a manner enabling the base section 22a to be attached/detached to/from the fixing pedestal 50. The plate section 44 is supported by the supports 54 in such a manner that the shaft section 22 projecting from this base section 22a is inserted in the insertion hole 44b. The drive section 56 performs rotary drive so as to enable positive/reverse rotation of the pinions, and is thereby able to raise/lower the plate section 44 along the axial direction of the shaft section 22.

The supply mechanism 48 supplies a paste-like dielectric elastomer material 60 onto the insertion hole 44b of the plate section 44 and to a peripheral edge of the insertion hole 44b. The paste-like dielectric elastomer material 60 is formed by rendering the above-described material of the dielectric elastomer layer 12 in a paste-like form by, for example, mixing it with a solvent. If the dielectric elastomer material 60 is configured from acrylic, then, for example, "VHB4910" (product name) manufactured by 3M Company, or the like, configured in a paste-like form, may be employed.

Figure 10:
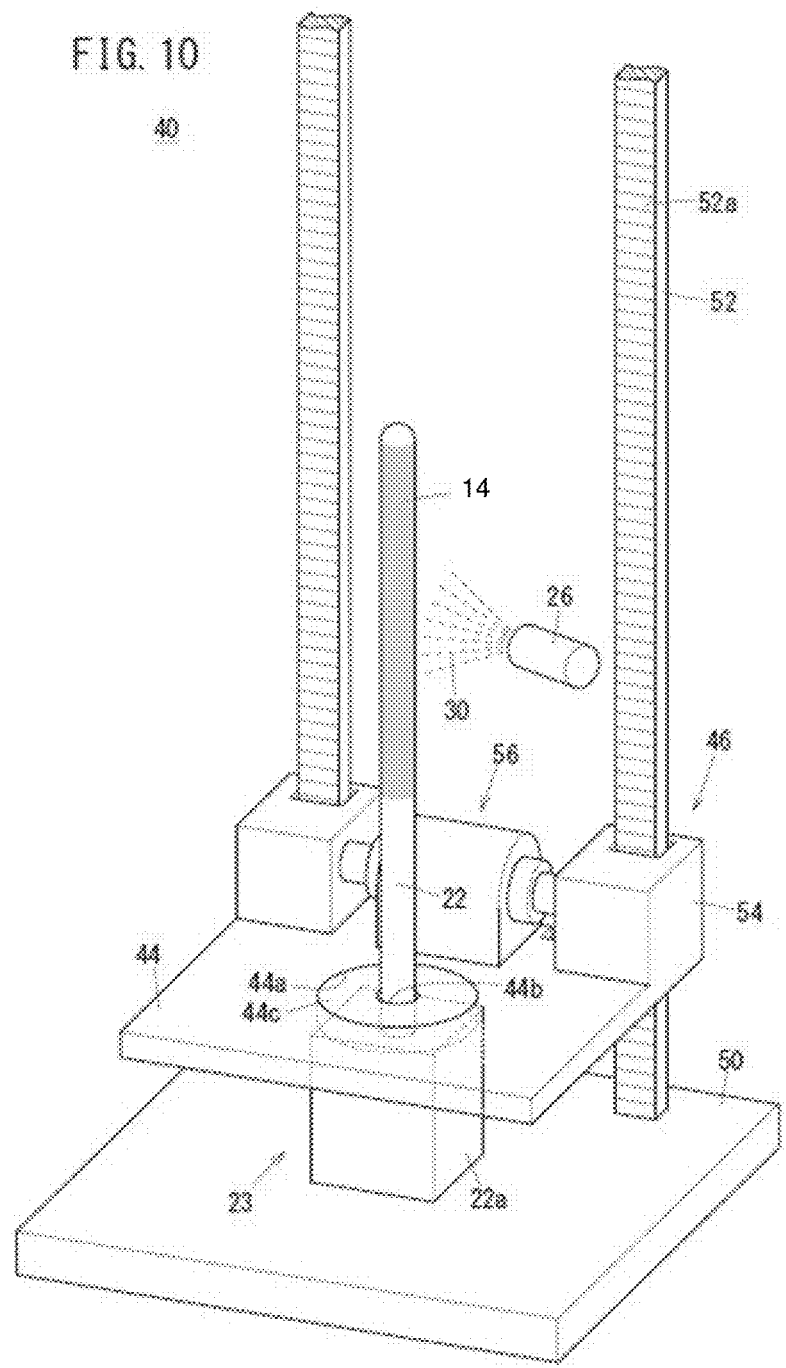
FIG. 10 is an explanatory diagram explaining a first electrode layer forming step in a method of manufacturing an actuator according to a second embodiment of the present invention.

In the method of manufacturing according to the second embodiment employing the manufacturing apparatus 40 configured basically as above, first, the diameter of the insertion hole 44b of the plate section 44 is adjusted. As a result, the diameter of the insertion hole 44b is set to a size which is made larger than an outer diameter of the electrode layer 14 disposed at a center in the radial direction of the actuator 10 and which is determined according to a coating thickness of the dielectric elastomer material 60 coating the outer circumferential surface of the electrode layer 14. Then, as shown in FIG. 10, the first electrode layer forming step is performed similarly to in the above-described method of manufacturing according to the first embodiment, in a state where the shaft section 22 has been inserted in the insertion hole 44b up to a base section side of the region where the electrode layer 14 is to be formed. As a result, a first layer electrode layer 14 of the shaft section 22 is formed on the outer circumferential surface of the shaft section 22.

Figure 11:
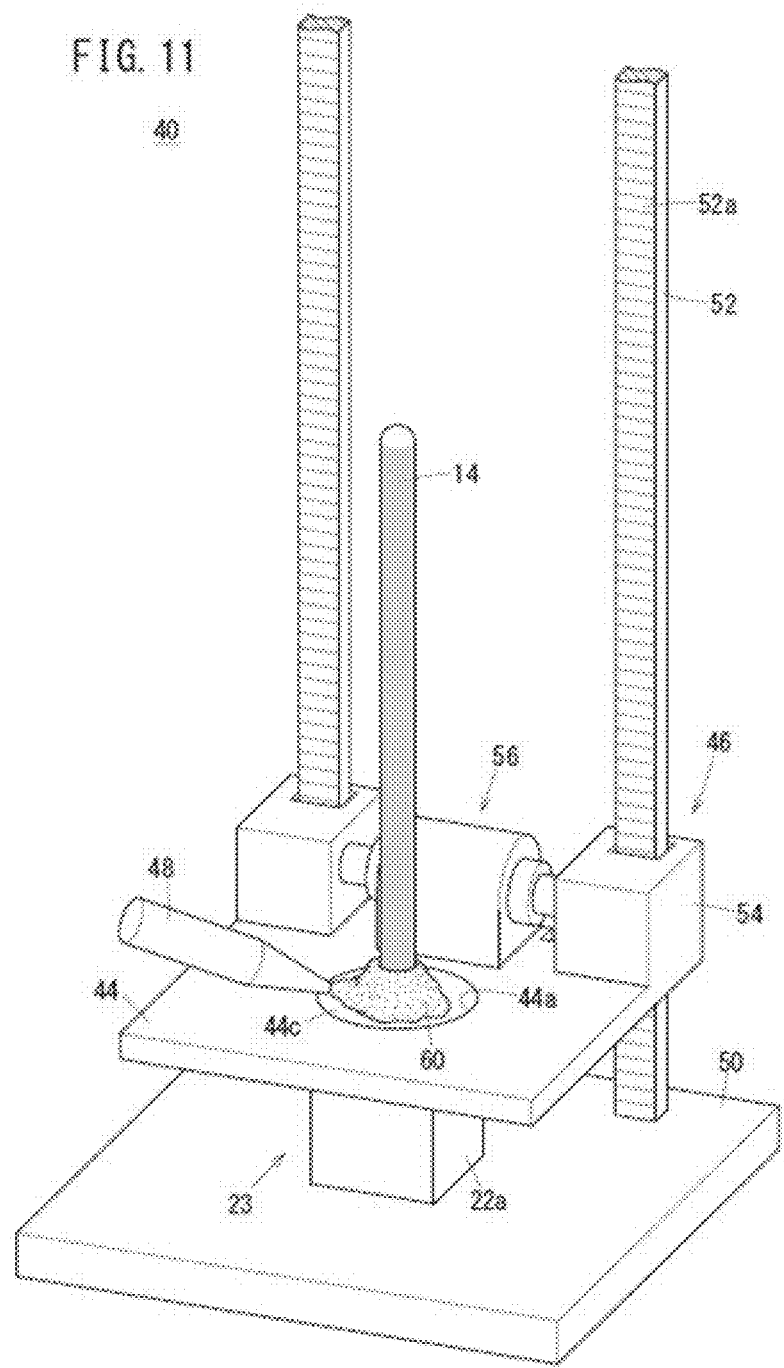
FIG. 11 is an explanatory diagram explaining what it looks like when a paste-like dielectric elastomer material is disposed on an insertion hole of a plate section and at a peripheral edge of the insertion hole, in a dielectric elastomer layer forming step after the first electrode layer forming step of FIG. 10.
Figure 12:
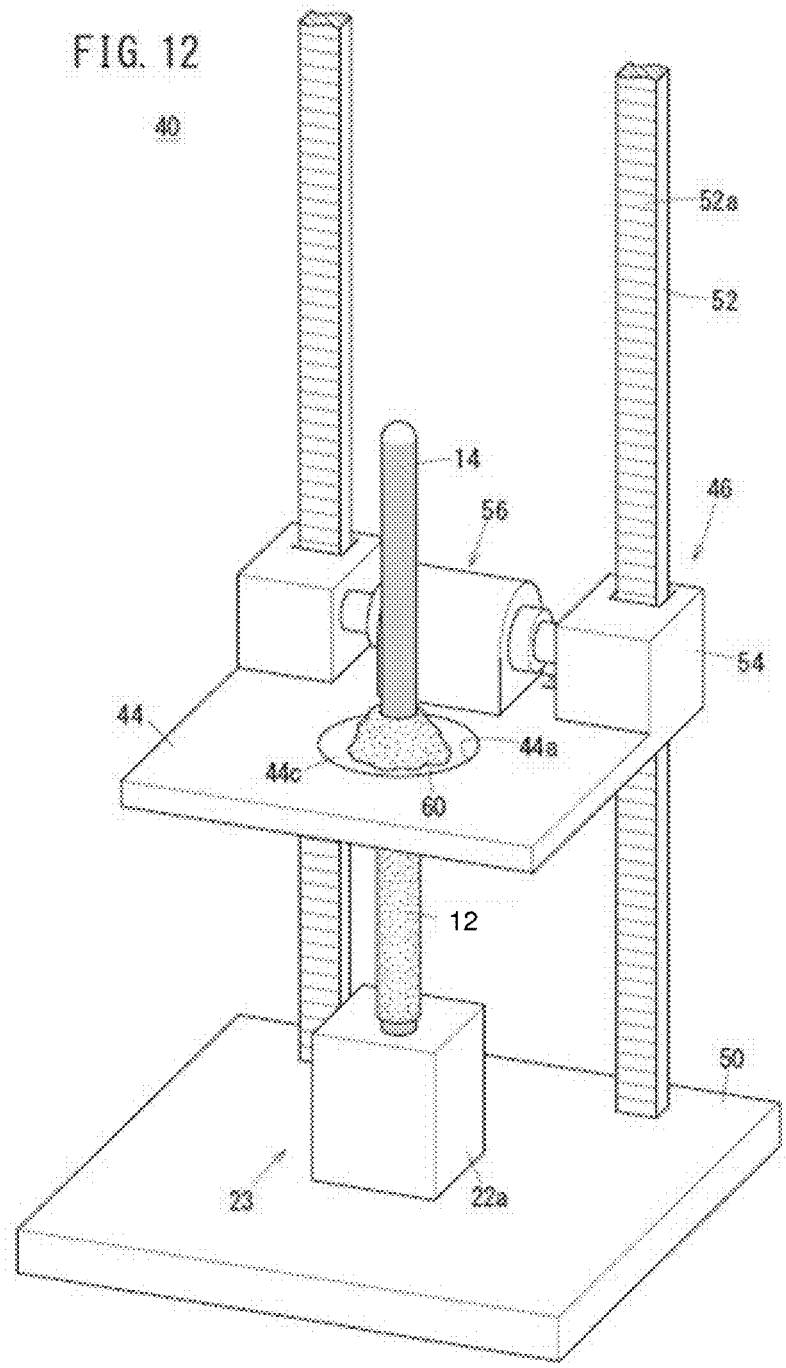
FIG. 12 is an explanatory diagram explaining what it looks like when the paste-like dielectric elastomer material is coated on an electrode layer, in the dielectric elastomer layer forming step of FIG. 11.

Next, there is performed the dielectric elastomer layer forming step in which the dielectric elastomer material 60 is provided to the outer circumferential surface of the electrode layer 14, thereby forming the dielectric elastomer layer 12. Specifically, as shown in FIG. 11, the dielectric elastomer material 60 is disposed on the insertion hole 44b and at the peripheral edge of the insertion hole 44b, by the supply mechanism 48. Then, as shown in FIG. 12, the plate section 44 is moved to a tip side of the shaft section 22 along the axial direction of the shaft section 22, by the drive mechanism 46.

As a result, the dielectric elastomer material 60 can be coated on the outer circumferential surface of the electrode layer 14, via the insertion hole 44b. By performing heat treatment on the dielectric elastomer material 60 that has been coated in this way, a first layer dielectric elastomer layer 12 can be formed.

Next, the disk-shaped member 44c attached to the through-hole 44a of the plate section 44 is exchanged to adjust the diameter of the insertion hole 44b, by the adjusting mechanism. As a result, the diameter of the insertion hole 44b is set to a size which is larger than an outer diameter of the electrode layer 14 (a second layer electrode layer 14) to be formed hereafter and which is suitable for a coating thickness of the dielectric elastomer material 60 to be formed hereafter.

Figure 13:
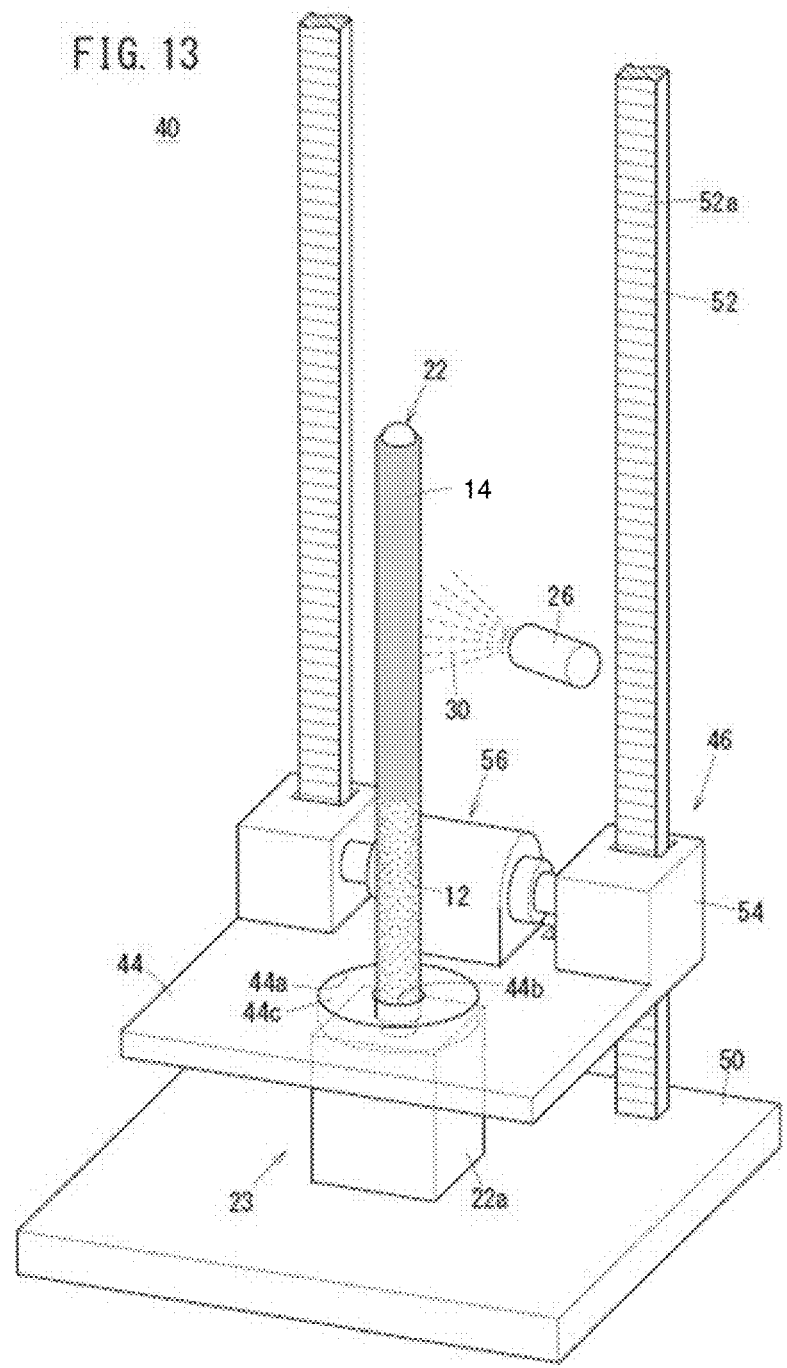
FIG. 13 is an explanatory diagram explaining a second electrode layer forming step after the dielectric elastomer layer forming step of FIG. 12.

Then, as shown in FIG. 13, the second electrode layer forming step is performed similarly to in the above-described method of manufacturing according to the first embodiment, in a state where the shaft section 22 has been inserted in the insertion hole 44b up to a base section side of the region where the electrode layer 14 is to be formed. As a result, the second layer electrode layer 14 can be formed on the outer circumferential surface of the dielectric elastomer layer 12.

Figure 14:
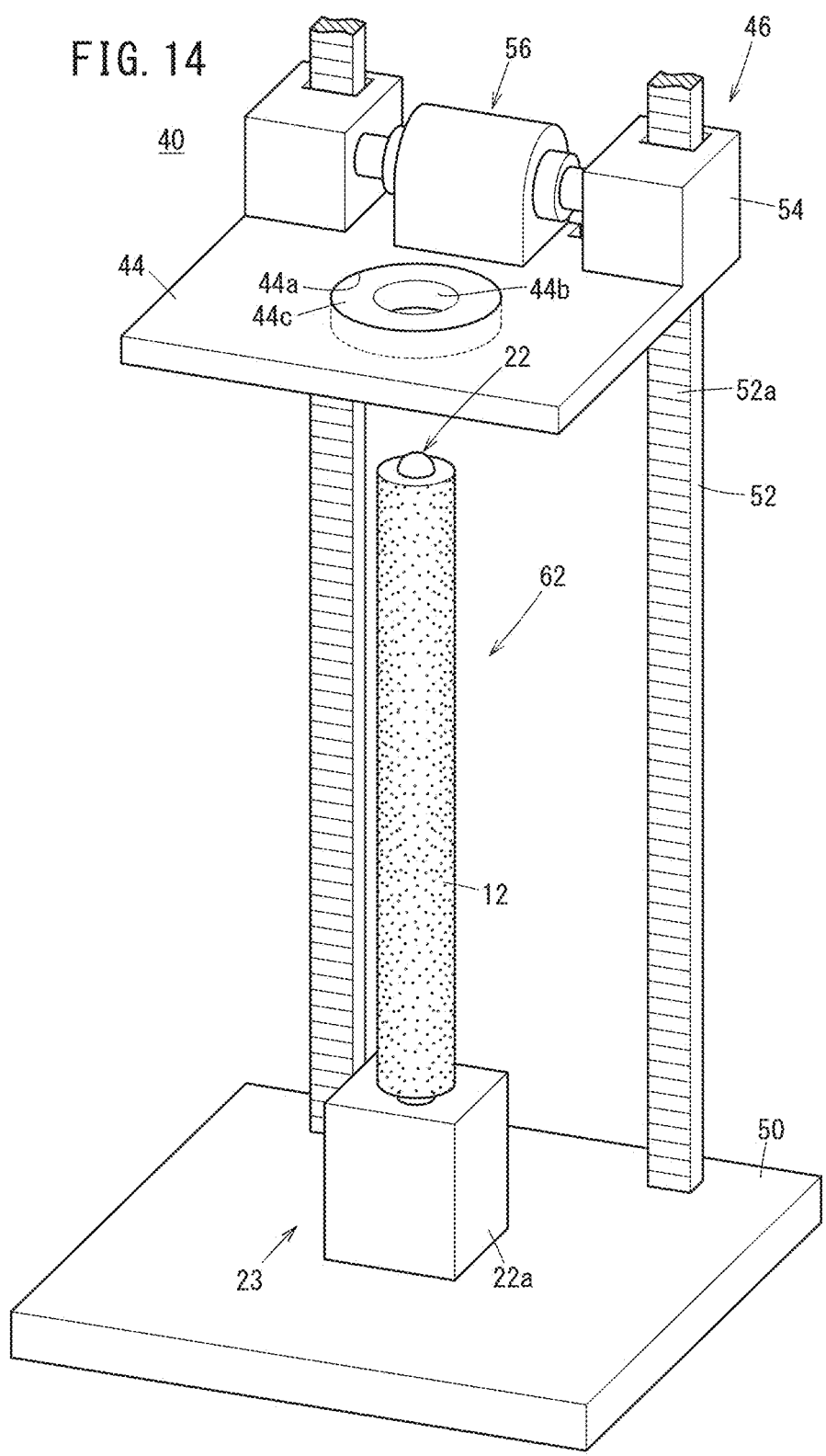
FIG. 14 is an explanatory diagram of a laminated body formed by repeating a plurality of times the dielectric elastomer layer forming step and the second electrode layer forming step, after the second electrode layer forming step of FIG. 13.

By repeatedly performing the dielectric elastomer layer forming step in which the dielectric elastomer layer 12 is formed on the outer circumferential surface of the electrode layer 14 and the second electrode layer forming step in which the electrode layer 14 is formed on the outer circumferential surface of the dielectric elastomer layer 12 as described above, it is possible to obtain a laminated body 62 that has laminated therein a required number of the electrode layers 14 and dielectric elastomer layers 12, as shown in FIG. 14.

After the shaft section 22 has been extracted from the laminated body 62 and, if required, the cutting step for cutting both ends in the axial direction of the laminated body 62 has been performed, the first wiring 16 and the second wiring 18 are provided to one end surface side of the laminated body 62 and the insulating film is provided to the other end surface side of the laminated body 62, whereby the actuator 10 shown in FIG. 1 can be obtained. The actuator 10 obtained by the method of manufacturing according to the second embodiment, unlike the actuator 10 obtained by the method of manufacturing according to the first embodiment, is capable of being used without heat treatment or a tensile force being applied.

As described above, in the method of manufacturing according to the second embodiment, the paste-like dielectric elastomer material 60 can be coated on the outer circumferential surface of the electrode layer 14 easily and with uniform thickness. Therefore, a dielectric elastomer layer 12 of desired thickness can be formed more simply and with higher precision, compared to when the dielectric elastomer layer 12 is formed by the likes of dipping, for example. Moreover, a required amount of the dielectric elastomer material 60 can also be reduced. Accordingly, due to this method of manufacturing, an actuator 10 in which cylindrical dielectric elastomer layers 12 and electrode layers 14 have been concentrically laminated can be obtained easily with high quality, and moreover at low cost.

Next, a method of manufacturing according to a third embodiment will be described with reference to FIG. 15. FIG. 15 is an enlarged cross-sectional view of an essential part of the manufacturing apparatus 40 provided with an insertion hole 70 according to a modified example. Note that, among the configuring elements shown in FIG. 15, those displaying functions and advantages the same as or similar to those of the configuring elements shown in FIGS. 3 to 14 will be assigned with the same reference symbols as those assigned in FIGS. 3 to 14, and detailed descriptions thereof will be omitted.

In this method of manufacturing, the actuator 10 can be manufactured similarly to in the method of manufacturing according to the second embodiment, excluding employing the manufacturing apparatus 40 in which the disk-shaped member 44c is provided with the insertion hole 70 instead of the insertion hole 44b. The insertion hole 70 has a truncated cone shape whose diameter contracts from a side of the one of its ends where the paste-like dielectric elastomer material 60 is disposed to a side of the other of its ends.

By configuring the insertion hole 70 to have the above-described truncated cone shape, it can be suppressed that the paste-like dielectric elastomer material 60 spreads on the plate section 44, and it is thereby possible for the paste-like dielectric elastomer material 60 to be efficiently coated on the outer circumferential surface of the electrode layer 14, even when viscosity of the paste-like dielectric elastomer material 60 is low. This makes it possible to easily achieve film-thinning of the dielectric elastomer layer 12, for example.

Next, a method of manufacturing according to a fourth embodiment will be described with reference to FIGS. 16 and 17. FIG. 16 is an explanatory diagram illustrating disposition of a first cylindrical member 74 on the paste-like dielectric elastomer material 60 disposed on the plate section 44, in the dielectric elastomer layer forming step in the method of manufacturing according to the fourth embodiment. FIG. 17 is an explanatory diagram illustrating application of the dielectric elastomer material 60 of FIG. 16 on the electrode layer 14.

Note that in FIGS. 16 and 17, the layer forming jig 23, an essential part of the plate section 44, the disk-shaped member 44c, and the first cylindrical member 74 are illustrated, but illustration of other configuring elements of the manufacturing apparatus 40 is omitted. Moreover, configuring elements displaying functions and advantages the same as or similar to those of the configuring elements shown in FIGS. 3 to 15, of the configuring elements shown in FIGS. 16 and 17 will be assigned with the same reference symbols as those assigned in FIGS. 3 to 15, and detailed descriptions thereof will be omitted.

In this method of manufacturing, the actuator 10 is manufactured using the manufacturing apparatus 40 that further includes a plurality of the first cylindrical members 74. The number of items prepared, of the plurality of first cylindrical members 74, accords with the number of laminations of the dielectric elastomer layers 12 required to configure the actuator 10. Inner diameters of these first cylindrical members 74 have sizes that are determined according to coating thicknesses of the dielectric elastomer material 60 when respective ones of the plurality of dielectric elastomer layers 12 are formed.

In the method of manufacturing according to the fourth embodiment, first, the diameter of the insertion hole 44b of the plate section 44 is adjusted to be set to a size that is determined according to the coating thickness of the dielectric elastomer material 60 to be coated on the outer circumferential surface of the electrode layer 14. Before inserting the shaft section 22 in this insertion hole 44b, the first electrode layer forming step is performed similarly to in the above-described method of manufacturing according to the first embodiment, thereby forming a first layer electrode layer 14 on the outer circumferential surface of the shaft section 22.

Next, the insertion hole 44b is disposed on the tip side of the shaft section 22 that has had the electrode layer 14 formed thereon, and the dielectric elastomer material 60 is supplied onto the insertion hole 44b and to the peripheral edge of the insertion hole 44b, by the supply mechanism 48. In addition, the first cylindrical member 74 of an inner diameter that is determined according to the coating thickness of the dielectric elastomer material 60 to be coated on the outer circumferential surface of the electrode layer 14, is prepared. Then, as shown in FIG. 16, the first cylindrical member 74 is detachably attached to the plate section 44, and so on, in such a manner that the first cylindrical member 74 is disposed on this dielectric elastomer material 60.

Next, as shown in FIG. 17, the plate section 44 and the first cylindrical member 74 are moved to the base end side of the shaft section 22 along the axial direction of the shaft section 22, by the drive mechanism 46 (refer to FIG. 10, and so on). As a result, the dielectric elastomer material 60 can be coated on the electrode layer 14 due to the dielectric elastomer material 60 being spread along between an inner circumferential surface of the first cylindrical member 74 and the outer circumferential surface of the electrode layer 14. The dielectric elastomer material 60 that has been coated in this way undergoes heat treatment and is left for a certain time, whereby the dielectric elastomer layer 60 is hardened. As a result, a first layer dielectric elastomer layer 12 can be formed.

Next, the second electrode layer forming step is performed similarly to in the above-described first embodiment, in a state where the plate section 44 and the first cylindrical member 74 have been moved to the tip side of the shaft section 22 along the axial direction of the shaft section 22, by the drive mechanism 46. Thereafter, the above-described dielectric elastomer layer forming step and second electrode layer forming step are repeated while adjusting the diameter of the insertion hole 44b and the inner diameter of the first cylindrical member 74, and so on, whereby the actuator 10 can be obtained.

It is clear from the above that in the method of manufacturing according to the fourth embodiment, the dielectric elastomer layer 12 can be formed by coating the dielectric elastomer material 60 on the electrode layer 14 while spreading the dielectric elastomer material 60 along between the inner circumferential surface of the first cylindrical member 74 and the electrode layer 14. This makes it easy for film-thinning of the dielectric elastomer layer 12 to be performed, and for a thickness of the dielectric elastomer layer 12 overall to be made substantially uniform. As a result, an actuator 10 capable of having its output controlled with high precision, can be obtained.

Next, a method of manufacturing according to a fifth embodiment will be described with reference to FIGS. 18 and 19. FIG. 18 is an explanatory diagram illustrating the paste-like dielectric elastomer material 60 disposed on an upper surface side of the plate section 44 and the first cylindrical member 74 disposed on a lower surface side of the plate section 44, in the dielectric elastomer layer forming step in the method of manufacturing according to the fifth embodiment. FIG. 19 is an explanatory diagram illustrating the dielectric elastomer material 60 of FIG. 18 coated on the electrode layer 14.

Note that in FIGS. 18 and 19 too, the layer forming jig 23, the essential part of the plate section 44, the disk-shaped member 44c, and the first cylindrical member 74 are illustrated, but illustration of other configuring elements of the manufacturing apparatus 40 is omitted. Moreover, configuring elements displaying functions and advantages the same as or similar to those of the configuring elements shown in FIGS. 3 to 17, of the configuring elements shown in FIGS. 18 and 19 will be assigned with the same reference symbols as those assigned in FIGS. 3 to 17, and detailed descriptions thereof will be omitted. In this method of manufacturing, the actuator 10 is manufactured using the manufacturing apparatus 40 that further includes: a holding mechanism (not illustrated) by which the base section 22a can be held above the plate section 44; and a plurality of the first cylindrical members 74.

Specifically, first, the first electrode layer forming step is performed similarly to in the above-described method of manufacturing according to the first embodiment, thereby forming a first layer electrode layer 14 on the outer circumferential surface of the shaft section 22. Next, the base section 22a is held above the plate section 44 by the holding mechanism, in such a manner that the tip side of the shaft section 22 is directed to the insertion hole 44b from above, with the insertion hole 44b having had its diameter adjusted according to the coating thickness of the dielectric elastomer material 60 to be coated on the outer circumferential surface of the electrode layer 14. In addition, the first cylindrical member 74 of an inner diameter that is determined according to the coating thickness of the dielectric elastomer material 60 to be coated on the outer circumferential surface of the electrode layer 14, is prepared to be detachably attached to the plate section 44, and so on. As a result, the first cylindrical member 74 is disposed below the insertion hole 44b, as shown in FIG. 18.

Next, the dielectric elastomer material 60 is supplied onto the insertion hole 44b and to the peripheral edge of the insertion hole 44b, by the supply mechanism 48. Next, as shown in FIG. 19, the plate section 44 and the first cylindrical member 74 are moved to the base end side of the shaft section 22 along the axial direction of the shaft section 22, by the drive mechanism 46 (refer to FIG. 10, and so on). As a result, the dielectric elastomer material 60 can be coated on the electrode layer 14 due to the dielectric elastomer material 60 being spread along between the inner circumferential surface of the first cylindrical member 74 and the outer circumferential surface of the electrode layer 14. The dielectric elastomer material 60 that has been coated in this way undergoes heat treatment and is left for a certain time, whereby the dielectric elastomer layer 60 is hardened. As a result, a first layer dielectric elastomer layer 12 can be formed.

Next, the second electrode layer forming step is performed similarly to in the above-described first embodiment, in a state where the plate section 44 and the first cylindrical member 74 have been moved to the tip side of the shaft section 22 along the axial direction of the shaft section 22, by the drive mechanism 46. Thereafter, the above-described dielectric elastomer layer forming step and second electrode layer forming step are repeated while adjusting the diameter of the insertion hole 44b and the inner diameter of the first cylindrical member 74, and so on, whereby the actuator 10 can be obtained.

It is clear from the above that in the method of manufacturing according to the fifth embodiment, similarly to in the above-described method of manufacturing according to the fourth embodiment, the dielectric elastomer layer 12 can be formed by coating the dielectric elastomer material 60 on the electrode layer 14 while spreading the dielectric elastomer material 60 along between the inner circumferential surface of the first cylindrical member 74 and the electrode layer 14. This makes it easy for film-thinning of the dielectric elastomer layer 12 to be performed, and for the thickness of the dielectric elastomer layer 12 overall to be made substantially uniform. As a result, an actuator 10 capable of having its output controlled with high precision, can be obtained.

In the method of manufacturing according to the fifth embodiment, it is preferable that the diameter of the insertion hole 44b and the inner diameter of the first cylindrical member 74 are matched, and that an end surface of the first cylindrical member 74 is brought into contact with an outer circumferential edge section of the insertion hole 44b in the plate section 44. In this case, when, as described above, the plate section 44 and the first cylindrical member 74 are moved along the axial direction of the shaft section 22 and the dielectric elastomer material 60 is spread along between the inner circumferential surface of the first cylindrical member 74 and the outer circumferential surface of the electrode layer 14, it can be avoided that the dielectric elastomer material 60 is disposed on an outer circumferential surface side of the first cylindrical member 74. This makes it possible for the dielectric elastomer material 60 to be coated on the electrode layer 14 without waste, whereby manufacturing costs of the actuator 10 are reduced.

Next, a method of manufacturing according to a sixth embodiment will be described with reference to FIG. 20. FIG. 20 is an explanatory diagram explaining the dielectric elastomer layer forming step in the method of manufacturing according to the sixth embodiment. Note that configuring elements displaying functions and advantages the same as or similar to those of the configuring elements shown in FIGS. 3 to 19, of the configuring elements shown in FIG. 20 will be assigned with the same reference symbols as those assigned in FIGS. 3 to 19, and detailed descriptions thereof will be omitted.

In this method of manufacturing, the actuator 10 is manufactured using the layer forming jig 23, a plurality of second cylindrical members 76, and the supply mechanism 48. The number of items prepared, of the plurality of second cylindrical members 76 accords with the number of laminations of the dielectric elastomer layers 12 required to configure the actuator 10. Inner diameters of these second cylindrical members 76 have sizes that are determined according to coating thicknesses of the dielectric elastomer material 60 when respective ones of the plurality of dielectric elastomer layers 12 are formed.

Specifically, in the method of manufacturing according to the sixth embodiment, first, the first electrode layer forming step is performed similarly to in the above-described method of manufacturing according to the first embodiment, thereby forming a first layer electrode layer 14 on the outer circumferential surface of the shaft section 22.

Next, the second cylindrical member 76 of an inner diameter suitable for the coating thickness of the dielectric elastomer material 60 to be coated on the outer circumferential surface of the electrode layer 14, is prepared, and the shaft section 22 on which the electrode layer 14 has been formed is inserted in an inside of the second cylindrical member 76.

Next, as shown in FIG. 20, the dielectric elastomer material 60 is supplied to a space between an inner circumferential surface of the second cylindrical member 76 and the electrode layer 14, by the supply mechanism 48. As a result, the dielectric elastomer material 60 can be coated on the outer circumferential surface of the electrode layer 14. After the dielectric elastomer material 60 that has been coated in this way has undergone heat treatment and been left for a certain time, thereby hardening the dielectric elastomer material 60, the second cylindrical member 76 is removed. As a result, a first layer dielectric elastomer layer 12 can be formed.

Thereafter, the second electrode layer forming step similar to in the method of manufacturing according to the first embodiment and the above-described dielectric elastomer layer forming step are repeated while adjusting the inner diameter of the second cylindrical member 76, and so on, whereby the actuator 10 can be obtained.

It is clear from the above that in the method of manufacturing according to the sixth embodiment, the dielectric elastomer layer 12 can be formed by coating the dielectric elastomer material 60 on the electrode layer 14 by supplying the dielectric elastomer material 60 between the inner circumferential surface of the second cylindrical member 76 and the electrode layer 14. This makes it easy for film-thinning of the dielectric elastomer layer 12 to be performed, and for the thickness of the dielectric elastomer layer 12 overall to be made substantially uniform. As a result, an actuator 10 capable of having its output controlled with high precision, can be obtained. Moreover, this method of manufacturing makes it possible for the actuator 10 to be obtained by an even simpler configuration, hence makes it possible for manufacturing costs of the actuator 10 to be reduced.

The present invention is not particularly limited to the above-described embodiments, and may undergo a variety of modifications in a range not departing from the scope of the present invention.

For example, although in the methods of manufacturing according to the above-described embodiments, a configuration was adopted whereby the electrode layer 14 was formed by spray-coating using the liquid form electrode material 30, the present invention is not particularly limited to this. The electrode layer 14 too may be formed using a sheet-like or paste-like electrode material (not illustrated), similarly to the dielectric elastomer layer 12.

Moreover, although in the methods of manufacturing according to the above-described second embodiment, third embodiment, fourth embodiment, and fifth embodiment, a configuration was adopted enabling the plate section 44 to be moved with respect to the shaft section 22 that had been fixed to the fixing pedestal 50, there may be adopted a configuration in which the plate section 44 is fixed by an unillustrated fixing means, and the shaft section 22 can be moved by an unillustrated drive mechanism.

What is claimed is:

1. A method of manufacturing an actuator in which a cylindrical dielectric elastomer layer and cylindrical electrode layers have been concentrically laminated in such a manner that the electrode layers respectively face an inner circumferential surface and an outer circumferential surface of the dielectric elastomer layer, comprising:
    forming a first electrode layer by providing an electrode material to an outer circumferential surface of a shaft section of a layer forming jig, the shaft section extending in a longitudinal direction from a base section of the layer forming jig to a distal end of the shaft section;
    forming a dielectric elastomer layer by providing a sheet of dielectric elastomer material to an outer circumferential surface of the electrode layer; and
    forming a second electrode layer by providing the electrode material to the outer circumferential surface of the dielectric elastomer layer,
    wherein the forming the dielectric elastomer layer comprises:
        arranging a surface of the sheet of dielectric elastomer material to be perpendicular to the longitudinal direction, and
        moving the layer forming jig along the longitudinal direction and into the surface of the sheet of dielectric elastomer material, wherein the distal end of the shaft section is covered by the surface of the sheet of dielectric elastomer material and serves as a fulcrum during the moving, and wherein the moving creates a tensile force that directs at least a portion of the sheet of dielectric elastomer material to the outer circumferential surface of the electrode layer.

2. The method of manufacturing an actuator according to claim 1, wherein the first electrode layer, the dielectric elastomer layer, and the second electrode layer form a laminated body, and wherein the method further comprises:
    forming ends of the laminated body by cutting the laminated body at positions along the longitudinal direction.

3. A method of manufacturing an actuator in which a cylindrical dielectric elastomer layer and cylindrical electrode layers have been concentrically laminated in such a manner that the electrode layers respectively face an inner circumferential surface and an outer circumferential surface of the dielectric elastomer layer, comprising:
    forming a first electrode layer by providing an electrode material to an outer circumferential surface of a shaft section of a layer forming jig;
    forming a dielectric elastomer layer by providing a paste of dielectric elastomer material to an outer circumferential surface of the electrode layer; and
    forming a second electrode layer forming by providing the electrode material to the outer circumferential surface of the dielectric elastomer layer,
    wherein the forming the dielectric elastomer layer comprises:

providing a plate section that has an insertion hole with a diameter larger than an outer diameter of the electrode layer, wherein the diameter is based on a coating thickness of the paste of dielectric elastomer material, disposing the paste of the dielectric elastomer material onto the plate section and over the insertion hole, and inserting a distal end of the shaft section into the insertion hole, whereby the paste of the dielectric elastomer material is coated onto the outer circumferential surface of the electrode layer.

4. The method of manufacturing an actuator according to claim 1, further comprising:

electrically connecting the first electrode layer to a first wiring, and electrically connecting the second electrode layer to a second wiring.

5. The method of manufacturing an actuator according to claim 1, wherein a material selected from the group consisting of acrylic, silicone, and polyurethane is employed as the dielectric elastomer material.

6. The method of manufacturing an actuator according to claim 3, further comprising:

electrically connecting the first electrode layer to a first wiring, and electrically connecting the second electrode layer to a second wiring.

7. The method of manufacturing an actuator according to claim 3, wherein a material selected from the group consisting of acrylic, silicone, and polyurethane is employed as the dielectric elastomer material.

8. The method of manufacturing an actuator according to claim 1, further comprising:

inserting the distal end of the shaft section into a through-hole of a ring member after the forming the second electrode layer; and forcing the second electrode layer to contact the dielectric elastomer layer by moving the ring member along the longitudinal direction.

* * * * *